United States Patent [19]

Lischke

[11] Patent Number: 4,899,060

[45] Date of Patent: Feb. 6, 1990

[54] DIAPHRAGM SYSTEM FOR GENERATING A PLURALITY OF PARTICLE PROBES HAIVNG VARIABLE CROSS SECTION

[75] Inventor: Burkhard Lischke, Munich, Fed. Rep. of Germany

[73] Assignee: Siemens Aktiengesellschaft, Berlin and Munich, Fed. Rep. of Germany

[21] Appl. No.: 368,959

[22] Filed: Jun. 13, 1989

Related U.S. Application Data

[63] Continuation of Ser. No. 191,708, May 9, 1988, abandoned.

[30] Foreign Application Priority Data

May 8, 1987 [DE] Fed. Rep. of Germany ....... 3715427

[51] Int. Cl.[4] ............................. H01J 1/52; H01J 3/12
[52] U.S. Cl. ............................... 250/505.1; 250/492.2
[58] Field of Search .............. 250/505.1, 492.23, 492.2

[56] References Cited

U.S. PATENT DOCUMENTS 4,182,958  1/1980  Goto et al. ..................... 250/492.23
4,524,278  6/1985  LePoole ........................... 250/492.2

FOREIGN PATENT DOCUMENTS 3504705   8/1986  Fed. Rep. of Germany .
57-206029 12/1982  Japan ............................. 250/492.23
58-44717  3/1983   Japan ............................. 250/492.2

OTHER PUBLICATIONS

Hans C. Pfeiffer, "Recent Advances in Electron-Beam Lithography for the High-Volume Production of VLSI Devices", IEEE Transactions on Electron Devices, vol. ED-26, No. 4, Apr. 1979, pp. 663-674.

Primary Examiner—Jack I. Berman
Attorney, Agent, or Firm—Hill, Van Santen, Steadman & Simpson

[57] ABSTRACT

A diaphragm system includes two diaphragms provided with the same multi-aperture arranged following one another in a beam path of lithography equipment so that recesses in the first diaphragm coincide with corresponding recesses in the second diaphragm. A primary particle beam is directed onto the first diaphragm which is equipped with deflection elements for individual displacement of the particle probes in a plane of the second diaphragm. In a second embodiment, the diaphragm system provides simultaneous variation of the cross section of all particle probes by providing that one of the two diaphragms be displaceable in a plane perpendicular to the beam direction.

4 Claims, 5 Drawing Sheets

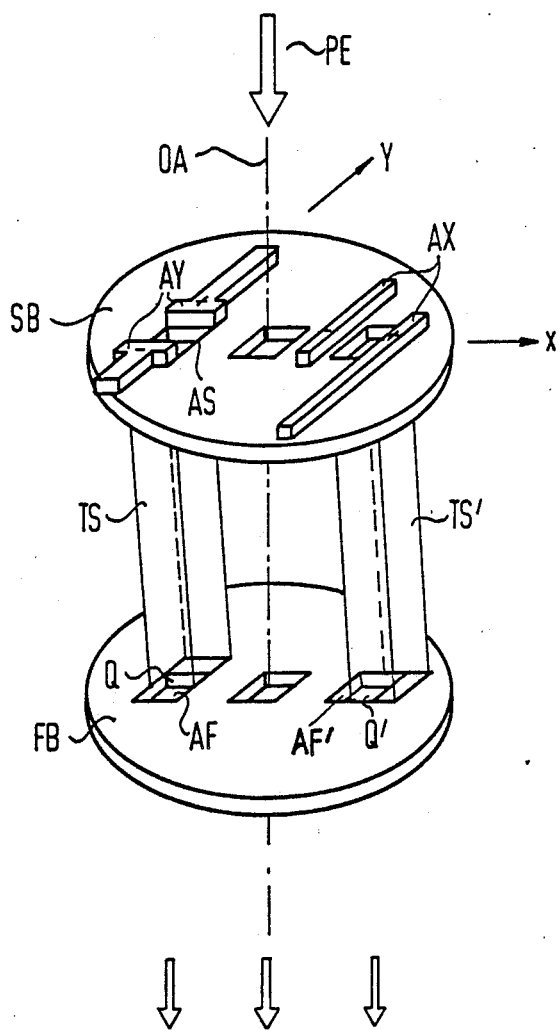

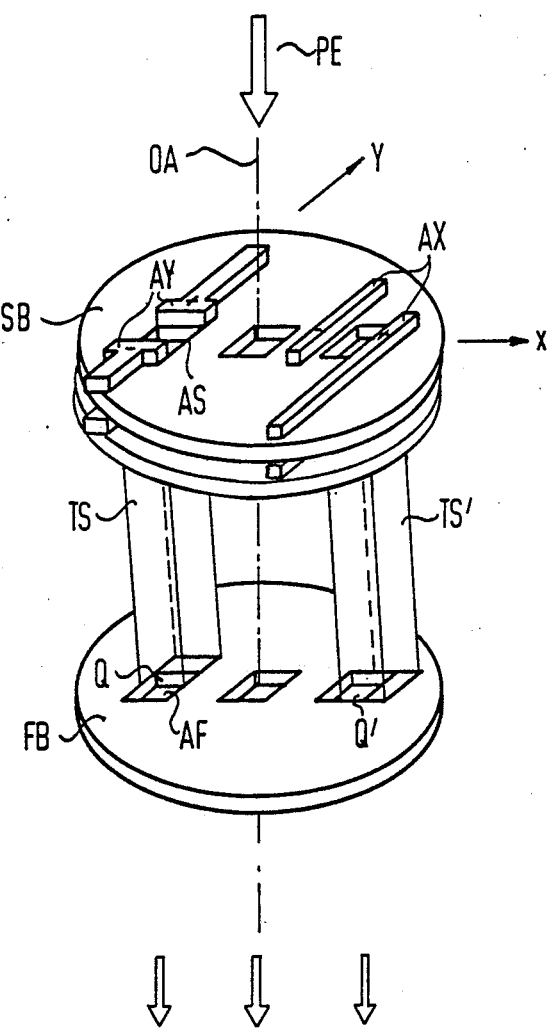

DIAPHRAGM SYSTEM FOR GENERATING A PLURALITY OF PARTICLE PROBES HAIVNG VARIABLE CROSS SECTION

This is a continuation of application Ser. No. 191,708, filed May 9, 1988, now abandoned.

BACKGROUND OF THE INVENTION

1. Field of the Invention

The present invention is directed generally to a diaphragm system for generating a plurality of particle probes having variable cross section, the system including first and second diaphragms.

2. Description of the Related Art

A diaphragm system including aperture plates is disclosed in IEEE Transactions on Electron Devices, Volume ED-26, No. 4, April 1979, pages 663 through 674, and in particular in FIGS. 3 and 4.

A diaphragm having a line-shaped multi-aperture structure and an electrode system for individual blanking of the particle probe which is generated with the assistance of the diaphragm is disclosed in German published application 35 04 705.

Only structures whose dimensions correspond to a multiple of the dimensions of the individual probes can be produced in modern lithograph equipment using aperture diaphragms for generating a plurality of individual probes (comb probes). The cross section of the individual probes should be adjustable in size and shape in order to generate arbitrary structures during lithography.

SUMMARY OF THE INVENTION

An object of the present invention is to provide a diaphragm system in which a plurality of particle probes having variable cross section can be generated. This and other objects are inventively achieved in a diaphragm system including first and second diaphrams oriented relative to one another so that recesses in the two diaphragms coincide with one another and including means for changing the position of the particle probes in a plane of the second diaphragm. In another development, first and second diaphragms are provided each having a multi aperture structure, and means for displacing one of the diaphragms relative to the other in a plane perpendicular to the propagating direction of the particle probes.

An advantage obtainable with the invention is that the probe diameter can be adapted to the desired design or pattern or to the raster dimension during the lithography process.

In preferred developments and improvements of the diaphragm system of the invention, deflection elements for individual displacement of the particle probes are arranged at the edge of recesses in the first diaphram. A first deflection element is arranged at an upper side of the first diaphragm and a second deflection element for deflecting particle probes in the second direction is arranged at an underside of the first diaphram. It is also possible that the first deflection element be arranged on the first diaphragm and the second deflection element for deflecting the particle probes in the second direction be arranged on a third diaphragm arranged immediately following the first diaphragm. The apertures in the diaphragms can be rectangular or quadratic openings which, in one embodiment are arranged in a line. Other shapes of apertures are, of course, also possible.

BRIEF DESCRIPTION OF THE DRAWINGS

FIG. 1 is a perspective view of a first exemplary embodiment of a diaphragm system according to the principles of the present invention;

FIG. 3b is a plan view of the second exemplary embodiment of FIG. 2a;

FIG. 4 is a perspective view of an embodiment of the invention including a third diaphragm.

DESCRIPTION OF THE PREFERRED EMBODIMENTS

Figure 2A:
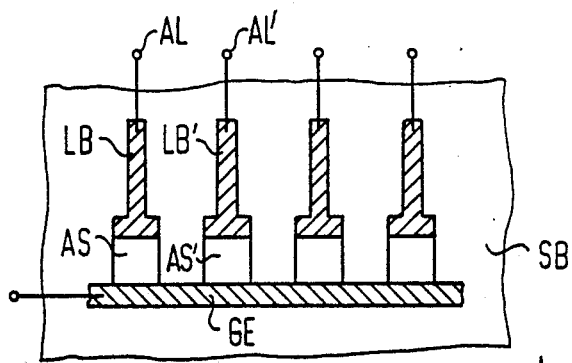
FIG. 2a is a plan view of a deflection system for a first diaphragm for illumination by a primary electron beam in accordance with the invention.

A diaphragm system is shown schematically in FIG. 1 for generating a plurality of particle probes having variable cross section. Such variable cross section particle probes are used, in particular, in lithography equipment as known from German published application 35 04 704 (and in particular in FIG. 1). The present diaphragm system, which is illuminated with a large area electron beam, replaces the aperture diaphragm as disclosed in the German published application.

The present diaphragm system is essentially composed of a first diaphragm SB referred to as a control diaphragm which is illuminated by a primary particle beam PE. The first diaphragm SB has a plurality of rectangular or quadratic recesses or openings AS arranged in a line for shaping a corresponding plurality of particle probes TS. In other words, the openings AS in the diaphragm SB permit portions of the primary beam PE to pass, thereby forming corresponding probes TS. The openings AS can be of other than quadratic shape. Preferrably, the diaphragm SB is perpendicular to the beam PE.

The diaphragm system also includes a second diaphragm FB referred to as a shaping diaphragm and arranged following the control diaphragm SB in a direction OA. The second diaphragm FB has the same multi-aperture structure as the first diaphragm SB. The diaphragms SB and FB are oriented relative to one another so that the recesses AS of the control diaphragm SB coincide with corresponding recesses AF of the shaping diaphragm FB. In other words, the recesses AS and AF lie over one another in the direction OA.

To change the probe cross section Q, the particle probes TS which are transmitted through the apertures AS, for example, from a band-shaped primary beam PE are imaged onto the shaping diaphragm FB. As shown in FIG. 1, the probes TS are shadow projected and are shifted in two mutually orthogonal directions with the assistance of deflection elements AX and AY disposed on the control diaphragm FB near of the recesses AS. In particular, the pair of deflection elements AY, when charged with an electrical potential, deflect the probe TS in the y direction. This results in part of the probe TS striking the second diaphragm FB and being occluded thereby. A further portion of the probe TS passes through the opening AF in the second diaphragm FB. This non-occluded portion has a cross section Q which is less than the cross section of the probe TS from which it was formed. The pair of deflection elements AX, when an electrical potential is applied, deflect the particle probe TS' in an x direction. This results in a part of the probe TS' being occluded and a part passing through the opening AF'. That part which passes through has a cross section Q'. For reasons of clarity, only one pair of each type of the deflection elements AX and AY are shown in FIG. 1 on the top surface of the first diaphragm SB. The cross sections Q and Q' of every probe TS and TS' can thereby be set to the desired size and shape by suitably selecting the potentials applied to the deflection elements AX and AY.

For space-saving reasons, the deflection elements AX and AY of the control diaphragm SB are preferrably separately arranged for every deflection direction on the upper and lower sides of the control diaphragm SB' respectively. In other words, the deflection elements AX are provided on one surface, for example, the top surface of the control diaphragm SB at each opening AS, while the deflection elements AY are applied to the other surface, for example, the bottom surface, of the control diaphragm at each opening AS. It is possible that the deflection elements AY be provided on the top surface and the deflection elements AX on the bottom, too. Other combinations of the deflection elements are also possible.

A possible embodiment of a control diaphragm SB is shown in FIG. 2a. The control diaphragm SB is composed of a high impedance substrate foil or sheet of, for example, silicon, having quadratic recesses AS and AS' for blanking out correspondingly shaped particle probes TS and TS'. The deflection elements shown in FIG. 2a are arranged at an edge region at one side of the recesses AS and AS' on a surface of the control diaphragm SB facing toward the primary beam PE. The deflection elements are executed as interconnects LB and LB' which are broadened at their inside ends adjacent the recesses AS and AS' and which are charged with suitable potentials via terminals AL and AL', respectively. The potentials applied to the interconnects LB and LB' result in deflection of the particle probes in a y direction. An interconnect GE which lies at a reference potential extends linearly along an opposing side of the openings AS and AS' from the interconnects LB and LB' to act as a reference electrode. The deflection electrodes LB and LB' as well as the interconnect GE is composed, for example, of gold. Depending upon the polarity and value of the potential applied to the deflection electrodes LB and LB' relative to the reference electrode GE, the probes TS and TS' are deflected in opposite directions to a greater or lesser extent.

Figure 2B:
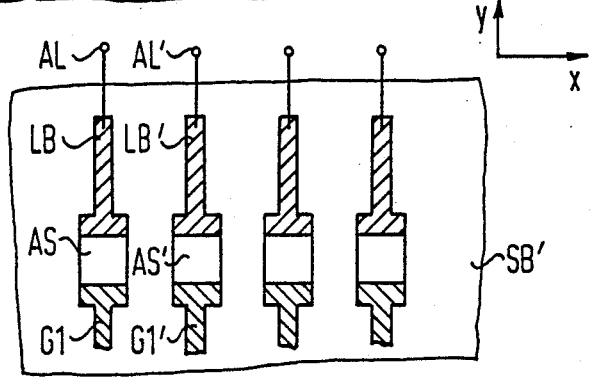
FIG. 2b is a plan view of a second embodiment of a deflection system of the invention.

Instead of the single linear interconnect GE, it is, of course, possible to provide individual electrodes G1 and G1' on a second embodiment of the control diaphragm as shown in FIG. 2b. The individual electrodes G1 and G1' can all lie at the same reference potential or instead have applied individually selectable, mutually different potentials. This adds a further degree of control to the particle probes TS and TS'.

Figure 2C:
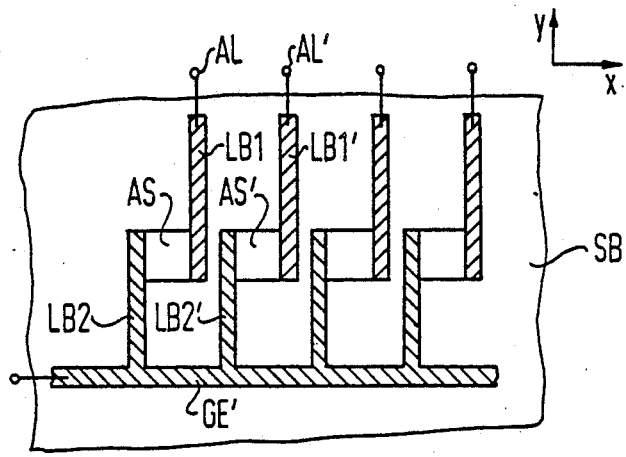
FIG. 2c is a plan view of a third embodiment of a deflection system.

Referring to FIG. 2c, deflection elements are also preferrably provided at an underside of the controlled diaphragm SB for shifting the particle probes in the direction of the X axis. The deflection elements of FIG. 2c can likewise be provided on the second embodiment of the control diaphragm SB'. Such deflection elements on the opposite side of the control diaphragm SB are each composed of an electrode pair LB1 and LB2 and LB1' and LB2', respectively, arranged at opposite edges of every recess AS and AS' at the sides not covered by the deflection elements of FIGS. 2a or 2b. The electrodes LB2 and LB2' are connected to a common electrode GE' which lies at a reference potential. Desired deflection potentials are again supplied through separate terminals AL and AL' to the electrodes LB1 and LB1', respectively, which lie opposite the interconnects LB2 and LB2'. Just as the deflection electrodes AY, can have the cooperating electrode in common (FIG. 2a) or separate (FIG. 2b), the electrode arrangement of FIG. 2c can have the common electrode GE' formed separately.

Referring to FIG. 4, the electrode systems for deflecting the particle probes in two mutually orthogonal directions can also be arranged on two control diaphragms SBA and SBB, each having the same multi-aperture structure and which lie immediately following one another in a direction OA. Such control diaphragms SBA and SBB are oriented relative to one another so that the recesses of the first control diaphragm SB coincide with the corresponding recesses of the second control diaphragm SBB in a direction OA. Either the deflection electrodes AX (or AY) can be on the first diaphragm SBA, with the other deflection electrodes AY (or AX) on the second diaphragm SBB.

Figure 3A:
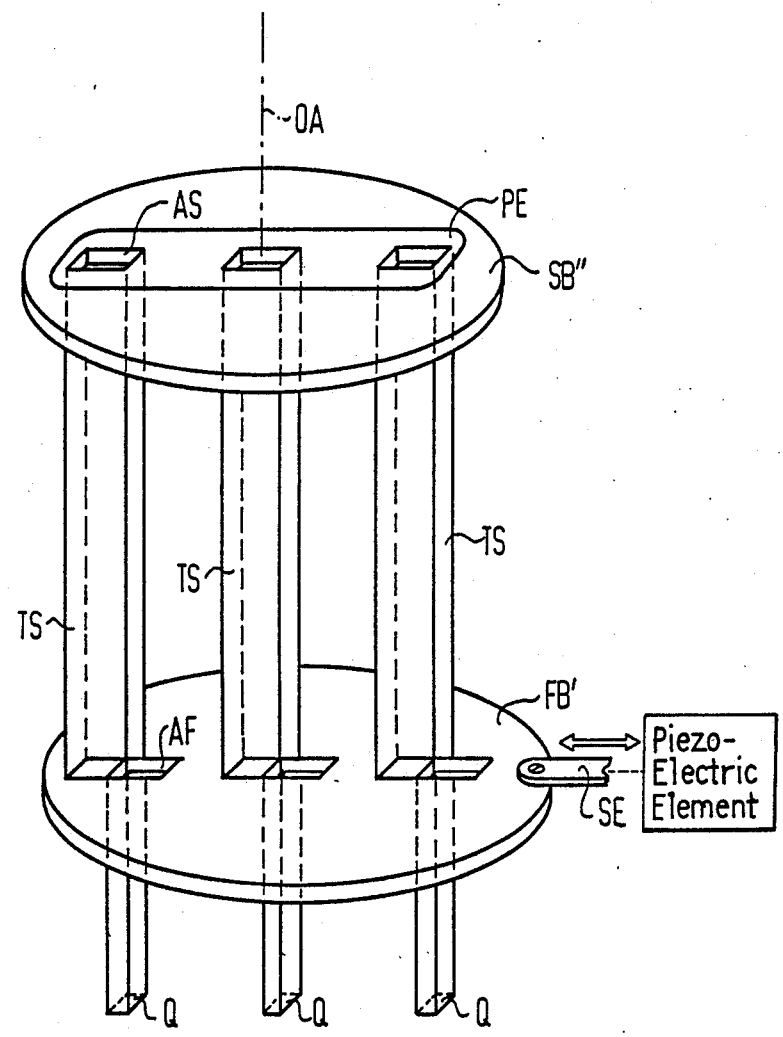
FIG. 3a is a perspective view of a second exemplary embodiment of a diaphragm system of the invention.

A comparatively far more simply constructed diaphragm system with which the cross section of all particle probes TS can be simultaneously varied and reduced to the desired dimensions is shown schemmatically in FIG. 3a. In accordance with the invention, the diaphragm system is composed of a circular control diaphragm SB" illuminated by a preferrably band shaped particle beam PE' the diaphragm SB comprising a plurality of rectangular or quadratic recesses AS arranged in a line. A shaping diaphragm FB' is arranged following the control diaphragm SB" in the direction OA. The shaping diaphragm FB' has the same multi-aperture structure as the control diaphragm SB". The shaping diaphragm FB' is displaceable in a plane perpendicular to the direction OA, for example, with the assistance of piezo-electric elements, as are known in the art, operating a control rod SE. In the unshifted position condition, the diaphragms SB" and FB' are oriented relative to one another so that the recesses AS of the control diaphragm SB" are in registration with the corresponding recesses AF of the shaping diaphragm FB'. By modifying the degree of overlap of the recesses AS and AF of the diaphragms SB" and FB', particle probes TS having a cross-section Q adapted to a respective desired pattern can be generated and imaged in a conventional way on a specimen to be structured.

Figure 3B:
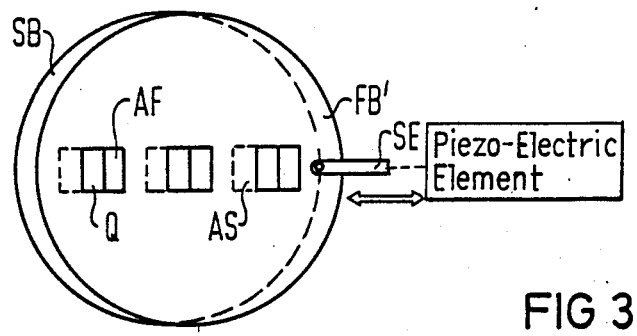
Figure 3C:
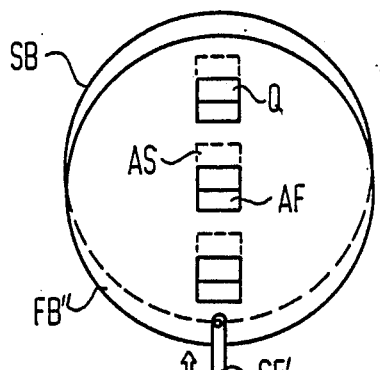
FIG. 3c is a plan view of an embodiment of a diaphragm system similar to that of FIG. 3a showing a diaphragm movement in a different direction.
Figure 3D:
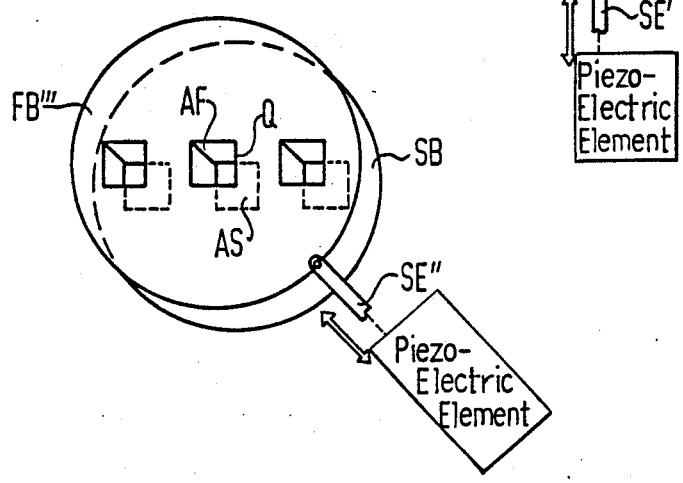
FIG. 3d is a plan view of an embodiment similar to the embodiment shown in FIG. 3a showing a diaphragm system with means for moving a diaphragm at yet a different angle.

In the bottom plan views of FIGS. 3b through 3d are shown the effects of moving the shaping diaphragm FB in different directions. In particular, FIG. 3b shows movement of the diaphragm FB' in an x-direction, while FIG. 3c shows the movement of a diaphragm FB" in a y-direction. In FIG. 3d is shown the effects of moving the diaphragm FB''' an equal amount in both the x and y direction so that a combined movement at a 45 degree angle occurs. As mentioned above, the control rod SE, SE', SE" is preferrably connected to known piezo-electric elements for moving the diaphragms.

The described diaphragms can be manufactured in a planar technique, for examle by using the method disclosed in German published application 35 04 705 and in particular on pages 11 and 12 thereof. It is thereby possible to concentrate an extremely great number of recesses or openings AS and AF with corresponding deflection elements AX and AY in an extremely small area. Thus, for example, two thousand recesses having a side length of 10×10 micrometers are conceivable. Such recesses can blank out a corresponding plurality of particle probes TS from a primary ion beam or electron beam PE. When such particle probes TS are imaged demagnified by a factor of 100 onto a specimen, then structures which have dimensions in the range of approximately 20 through 100 nanometers can be generated.

The present invention, of course, is not limited to the described exemplary embodiments. Thus, the diaphragms SB and FB can also be covered with a conductive layer outside the recesses AS and Af for the diversion of incident primary particles. It is also not necessary to arrange the recesses AS and AF in a row. For example, such recesses can lie laterally offset to one another.

Displacement means other than the deflection elements set forth can also be used for setting the size and shape of the particle probes.

In the diaphragm system of FIGS. 3a through 3d, it is of course possible to shift the diaphragm SB instead of the diaphram FB or to shift both diaphragms in common to a different extent or in a different direction in a plane perpendicular to the beam direction.

Although other modifications and changes may be suggested by those skilled in the art, it is the intention of the inventor to embody within the patent warranted hereon all changes and modifications as reasonably and properly come within the scope of his contribution to the art.

I claim:

1. A diaphragm system for generating a plurality of particle probes having variable cross sections from a particle beam, comprising:
   a first diaphragm for receiving a particle beam and having a first multi-aperture structure;
   a second diaphragm disposed following said first diaphragm in a direction of the particle beam, said second diaphragm having a second multi-aperture structure corresponding to said first multi-aperture structure of said first diaphragm, said first and second diaphragms oriented relative to one another so that in a non-displaced condition apertures of said first multi-aperture structure coincide with corresponding apertures of said second multi-aperture structure; and
   means for displacing one of said first or second diaphragms in a plane perpendicular to the direction of the particle beam.

2. A diaphragm system as claimed in claim 1, wherein said multi-aperture structure of said first and second diaphragms have rectangular or quadratic apertures.

3. A diaphragm system as claimed in claim 2, wherein said apertures are arranged along a line.

4. A diaphragm system as claimed in claim 1, wherein said means for displacing is a means for relative shifting of said first and second diaphragms relative to one another.

* * * * *